(12) United States Patent
Sawyer

(10) Patent No.: US 6,590,826 B1
(45) Date of Patent: Jul. 8, 2003

(54) SELF-ADDRESSING FIFO

(75) Inventor: Nicholas J. Sawyer, Opio (FR)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/056,320

(22) Filed: Jan. 22, 2002

(51) Int. Cl.[7] .............................................. G11C 8/00
(52) U.S. Cl. ................... 365/230.03; 365/221
(58) Field of Search ................. 365/230.05, 221, 365/189.04

(56) References Cited

U.S. PATENT DOCUMENTS

| | | | |
|---|---|---|---|
| RE34,363 E | | 8/1993 | Freeman |
| 5,255,239 A | * | 10/1993 | Taborn et al. ......... 365/230.05 |
| 5,267,191 A | * | 11/1993 | Simpson ................ 365/221 |
| 5,566,123 A | | 10/1996 | Freidin et al. |
| 5,898,893 A | | 4/1999 | Alfke |
| 5,914,616 A | | 6/1999 | Young et al. |
| 5,933,023 A | | 8/1999 | Young |
| 6,226,338 B1 | * | 5/2001 | Earnest ................ 365/189.05 |

OTHER PUBLICATIONS

Nick Sawyer, Entitled, "Self–Addressing FIFO", available from Xilinx, Inc., 2100 Logic Drive, San Jose, CA 95124, Dated: Nov. 2, 2001, XAPP291 (v1.0). pp 1–4.

* cited by examiner

*Primary Examiner*—Huan Hoang
(74) *Attorney, Agent, or Firm*—Edel M. Young; William Paradice, III

(57) ABSTRACT

A self-addressing FIFO for transferring data between clock domains while avoiding the necessity of using a clock tree stores address information as bits of a data word and uses these bits to generate the next address, thus eliminating loading the clock signal with a separate counter. While data must be valid at the clock edges and the clock period still needs to be controlled, clock skew is not an issue and therefore general purpose routing may be used for the input or output clock. Users may input or output data to external devices without ever using on-board global clock resources.

9 Claims, 1 Drawing Sheet

SELF-ADDRESSING FIFO

FIELD OF THE INVENTION

The present invention relates to functions that can be performed by field programmable gate arrays (FPGAs) and uses made of FPGAs.

BACKGROUND

Field programmable gate arrays (FPGAs) are integrated circuits programmable by a user to perform complex functions. They include logic blocks and routing lines. The logic blocks typically include lookup tables that perform any function of the input signals. For example, a four-input lookup table can perform any of over 65,000 functions of the four input signals. The routing lines can be connected to carry signals between the logic blocks. Programming of the FPGA is performed by loading a bitstream of 0's and 1's into an array of memory cells that connect or don't connect routing lines to each other and to the logic blocks, and that store the values of the lookup tables. The memory cells also program multiplexers that route internal signals within the logic blocks. The first FPGA is described by Freeman in U.S. Reissue Patent Re 34,363. A more recent FPGA is described by Young et al. in U.S. Pat. No. 5,914,616. The information in these patents is incorporated herein by reference.

One feature of more recent FPGAs is logic blocks usable as dual port RAMS. Freidin et al. in U.S. Pat. No. 5,566,123 describe a synchronous dual port RAM. Also available in more recent FPGAs are blocks of RAM memory accessible to the logic blocks. Young in U.S. Pat. No. 5,933,023 describes one such structure. These patents are also incorporated herein by reference.

The true dual-port structure of the block RAMs includes input and output data buses plus address and control signals for each port. Data can be independently read from and written to each port. Both read and write accesses are synchronized to the appropriate port clock, with a positive or negative selectable edge. The only operational limitation is not to write data to a given address from one port while it is being read from the other port.

The block memories in the Virtex™-II FPGA architecture available from Xilinx, Inc., assignee of the present invention, are capable of supporting data bus widths of up to 36-bits. To allow for parity, the basic array size of the block memory is 18 Kbits. Each port may be independently configured for a specific data bus width. For example, Port A can be configured as a 512×36 memory, and port B configured differently as a 2048×9 memory. Using these features, clock domains are safely crossed at the same time as the data width is converted. As an example, the output buffer on a communication system could use 36-bit wide data written at 50 MHz, and read as 9-bit wide data at 155 MHz. All the various combinations of memory structure are shown in Table 1.

TABLE 1

| Possible Dual Port RAM Configurations | |
| --- | --- |
| Port A | Port B |
| 512 × 36 | 512 × 36, 1024 × 18, 2048 × 9, 4096 × 4, 8192 × 2, 16384 × 1 |
| 1024 × 18 | 1024 × 18, 2048 × 9, 4096 × 4, 8192 × 2, 16384 × 1 |
| 2048 × 9 | 2048 × 9, 4096 × 4, 8192 × 2, 16384 × 1 |
| 4096 × 4 | 4096 × 4, 8192 × 2, 16384 × 1 |
| 8192 × 2 | 8192 × 2, 16384 × 1 |
| 16384 × 1 | 16384 × 1 |

It is known to use FPGAs to form first-in-first-out (FIFO) memories. Alfke in U.S. Pat. Ser. No. 5,898,893 describes such a FIFO. This patent is incorporated herein by reference. A FIFO stores data in sequential memory locations and uses a read counter for determining which memory location to read next and a write counter for determining which memory location to write to next. The read and write counters are controlled by independent clock signals provided by the devices that are writing to and reading from the FIFO.

SUMMARY OF THE INVENTION

According to the invention, a self-addressing FIFO uses these block memories to store both data and address information in a single memory location. Thus, no external counters are required for incrementing the address. The self-addressing FIFO counters are implemented as a ROM based sequencer inside the same memory being used for data storage. Only flag and status information logic are used. An advantage of the invention is in using only one clock load. Thus, clock skew does not occur. In addition, the status mechanism is very simple. These FIFOs are desirable for data throttling in continuous data systems more than for use when full or empty detection is frequently required in frame based data systems. The self-addressing FIFO is a small and novel mechanism for transferring data between clock domains while avoiding the necessity of using a clock tree. The only constraints are that data must be valid at the clock edges and the clock period still needs to be controlled. Since clock skew is not an issue, general purpose routing may be used for the input and output clocks, depending on the system architecture.

DETAILED DESCRIPTION

Figure 1:
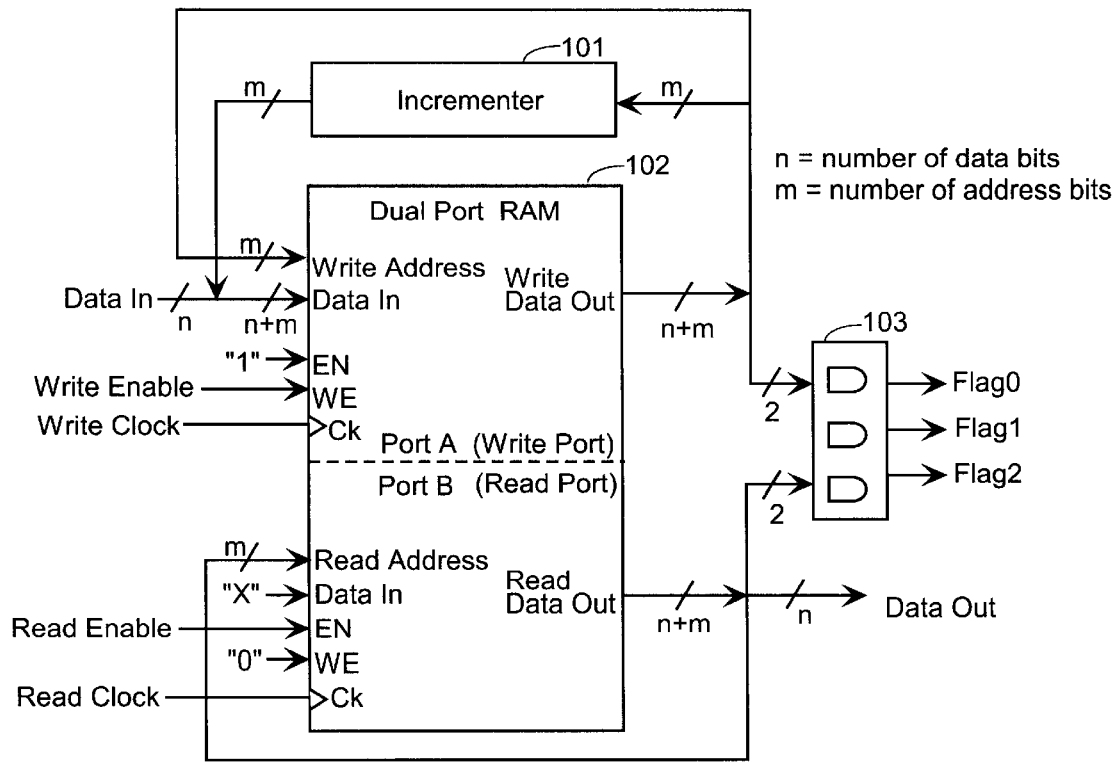
FIG. 1 shows a self-addressing FIFO according to the invention.

By deasserting the write enable pin, a synchronous RAM becomes a synchronous ROM, or in other words, a sequencer. The contents of each of the ROMs in an FPGA can be initialized via the bitstream at device power-up. Essentially any sequence and therefore any state machine (within input and output pin limits) can be implemented in the ROM. The n-bit counter is a trivial case; it is a state machine with "n" inputs and "n" outputs. The count order is determined by the contents of the memory. The count speed is governed by the output enable control, effectively making the output enable control a clock enable signal generator. With counters implemented in one block memory, and data storage in another, a FIFO can be built. However, this method gives a fanout of two on the read and write clocks. Although better than the classic FIFO design, there is still a possibility of clock skew.

A second method uses a feedback mechanism. M address bits are fed back from the RAM output data port to its address port. The same m bits are fed to a simple incrementer circuit. The output of the incrementer circuit is combined with the incoming data word. This next address plus data word is written synchronously into the next memory location. The only initialization needed is presetting the RAM outputs to x01 at reset.

FIG. 1 shows a self-addressing FIFO according to the invention. This self-addressing FIFO includes an adder 101, a dual port RAM 102, and flag logic 103. Port A of dual port RAM 102 is used as the Write port and port B is used as the Read port. (Of course, all words in dual port RAM 102 can be accessed through both ports.)

The counters are implemented as a ROM based sequencer inside the same memory being used for data storage. Some bits of each word in the memory are used as the counter storage, and the rest is used for data storage. For example, a 36-bit word can contain 32 bits of data and four bits of address, to give a 16-deep by 32-wide FIFO. Or the 36-bit word could have nine bits of address and 27 bits of data to give a 512-deep by 27-wide FIFO. The choice is up to the designer of a system using the FIFO of the invention.

Preferably, the top two bits of the incrementer circuit are Gray encoded so that only one of these two bits can ever change at any one clock transition. This minimizes any possibility of error when reading the flags, but it makes the incrementer slightly more complicated, and therefore slower. To maximize the speed of the design, a pure binary incrementer can be used, but the flags will need to be checked twice to ensure a valid flag value.

An example data transfer is started by writing data (23) to location x00 when the FPGA bitstream is loaded. After the Input Clock edge, the data output n+m of port A contains x0123. The lower data byte n (23) is ignored, and the upper byte m (x01) is fed back as the address for the next write. Adder 101 adds one to x01 for merging with the next incoming data. For example, if the next incoming data is 45, then x0245 is written into location x01. This value then appears at the output of port A. The next cycle will write a value including address x03 to location x02 and so forth.

For reading data, an Output Clock and optional Output Enable signal are applied to Port B. Data is read synchronous to the Output Clock. The lower byte n is the valid data that was written into Port A of the FIFO. The upper byte m contains the address for the next read. The upper byte m is therefore fed back to the address inputs of Port B.

Full/Empty Flags

Having covered the basic FIFO operation, one very important feature remains. Indicating whether a FIFO is full, empty, or somewhere in between is accomplished by a set of flags. Since the top two bits of the counters are Gray coded, only one of the two bits changes at a time. It is safe to compare the top two bits of the write counter with the top two bits of the read counter, even though they are in two separate time domains and this is accomplished by flag logic 103. This comparison gives three flag outputs.

Flag0: The FIFO is between empty and one-half full
Flag1: The FIFO is between one-quarter to three-quarters full
Flag2: The FIFO is between one-half full and full This flag logic 103 gives a very simple yet elegant mechanism for handling FIFO requests. To take advantage of this method, use flag1 (retimed to the receiver clock domain) as the FIFO read enable. In this way the FIFO is between one quarter and three quarters full, and never near overflow or emptied. Thus, all asynchronous conditions for enabling Read and Write operations are avoided. A standard system is also assumed to have continuous input data.

A description of the counter and flag operation is given as follows. If the top bit of the Data Out signal from port A (the Write port) is different from the top bit of the Data Out signal from port B (the Read port), then the Read and Write counters are in different portions of the memory and the FIFO is neither nearly empty nor nearly full, and both Read and Write operations are safe. If the top bits are the same and the second bits are different, the FIFO is still between one quarter and three quarters full. If the top and second bits are both the same, then the Read and Write addresses are too close (in one embodiment). In this case Flag1 failed and one of Read and Write is disabled. Flag0 and Flag2 determine which is disabled. Alfke in U.S. Pat. No. 5,898,893 describes logic that can accomplish this result.

What is claimed is:

1. A self-addressing FIFO comprising:
   a dual port RAM comprising
      a Write Data In port for receiving data to be written to the dual port RAM,
      a Write Data Out port,
      a Write Address port for selecting a write address to receive the data to be written,
      a Read Data Out port for providing data from the dual port RAM, and
      a Read Address port for selecting a read address to provide data to the Read Data Out port;
   an incrementer connected to receive at least some bits from the Write Data Out port and supply the write address to the Write Address port, the incrementer functioning to add one to the at least some bits from the Write Data Out port in generating the write address to the Write Address port; and
   a flag circuit receiving signals from the Write Data Out port and the Read Data Out port, and generating an enable signal for controlling a Read Enable port of the dual port RAM.

2. A self-addressing first-in, first-out (FIFO) circuit, comprising:
   a dual ported random access memory (RAM) having a write address input, a write data input, a write data output, and a plurality of memory locations each for storing data and an address;
   an incrementer having an input coupled to the write data output and an output coupled to the write data input; and
   a flag circuit having an input coupled to the write data output.

3. The FIFO circuit of claim 2, wherein the incrementer receives the address from the RAM.

4. The FIFO circuit of claim 3, wherein the incrementer adds one to the address received from the RAM to generate a new address to be stored with next data to be written to the RAM.

5. The FIFO circuit of claim 1, wherein the dual ported RAM further comprises a read enable input coupled to an output of the flag circuit.

6. The FIFO circuit of claim 5, wherein the flag circuit generates a flag in response to address information received from the RAM, and provides the flag as an enable signal to the read enable input of the RAM.

7. A method of implementing a self-addressing first-in, first-out (FIFO) circuit in a random access memory (RAM), comprising:
   writing data to a first portion of a memory location in the RAM;
   writing an address to a second portion of the memory location in the RAM;

reading the address from the RAM; and writing next data to another memory location in the RAM, the another memory location identified by the address.

8. The method of claim 7, further comprising:

incrementing the address to generate a new address; and writing the new address to the another memory location.

9. The method of claim 7, further comprising:

generating a flag in response to address information received from the RAM; and providing the flag as a read enable signal to the RAM.

* * * * *